United States Patent [19]

Somekh et al.

[11] 4,231,811
[45] Nov. 4, 1980

[54] VARIABLE THICKNESS SELF-ALIGNED PHOTORESIST PROCESS

[75] Inventors: Sasson Somekh, Redwood City; C. Norman Ahlquist, Menlo Park, both of Calif.

[73] Assignee: Intel Corporation, Santa Clara, Calif.

[21] Appl. No.: 75,095

[22] Filed: Sep. 13, 1979

[51] Int. Cl.³ .......................................... H01L 21/26
[52] U.S. Cl. ................................... 148/1.5; 148/187; 29/578; 250/492 A
[58] Field of Search ................... 148/1.5, 187; 29/578; 250/492 A

[56] References Cited

U.S. PATENT DOCUMENTS

| | | | |
|---|---|---|---|
| 3,920,483 | 11/1975 | Johnson | 148/1.5 |
| 3,997,367 | 12/1976 | Yau | 148/1.5 |
| 4,035,226 | 7/1977 | Farber et al. | 148/1.5 |
| 4,137,458 | 1/1979 | King et al. | 250/492 A |
| 4,140,913 | 2/1979 | Anger et al. | 250/492 A |
| 4,144,101 | 3/1979 | Rideout | 148/187 |
| 4,149,904 | 4/1979 | Jones | 148/1.5 |
| 4,163,155 | 7/1979 | Alles et al. | 250/492 A |
| 4,182,023 | 1/1980 | Cohen et al. | 29/578 X |

Primary Examiner—G. Ozaki
Attorney, Agent, or Firm—Blakely, Sokoloff, Taylor & Zafman

[57] ABSTRACT

A process for forming with a single masking step regions of different thicknesses in a photo-sensitive layer is disclosed. A masking member or reticle includes opaque and transparent areas and areas with a grating. The pitch of the periodic grating is of a lesser dimension than can be resolved by the masking projection apparatus. The photo-sensitive region illuminated by the grating receives uniform illumination at an intermediate intensity, thereby providing, after developing, a layer with regions of intermediate thickness.

11 Claims, 6 Drawing Figures

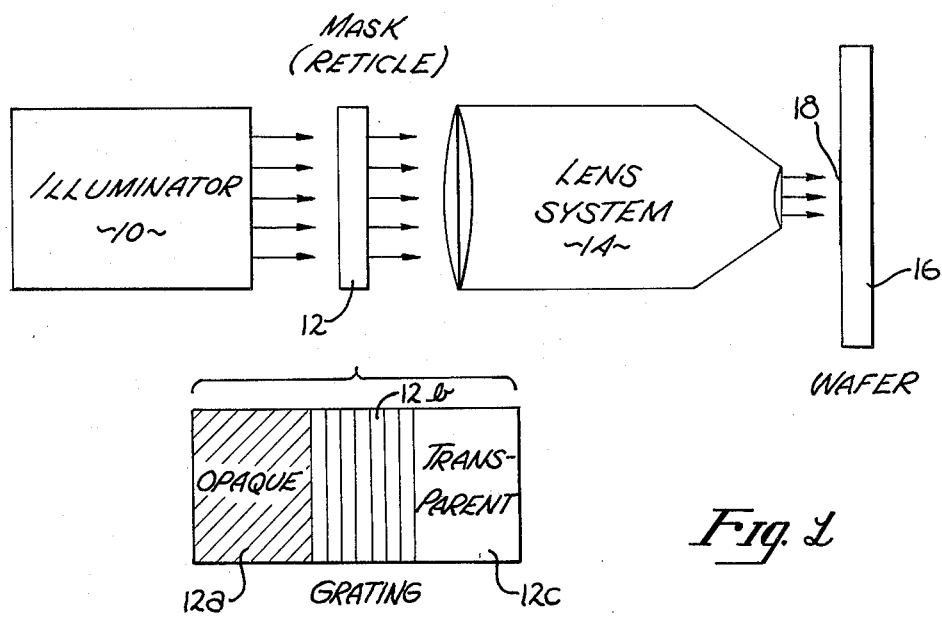
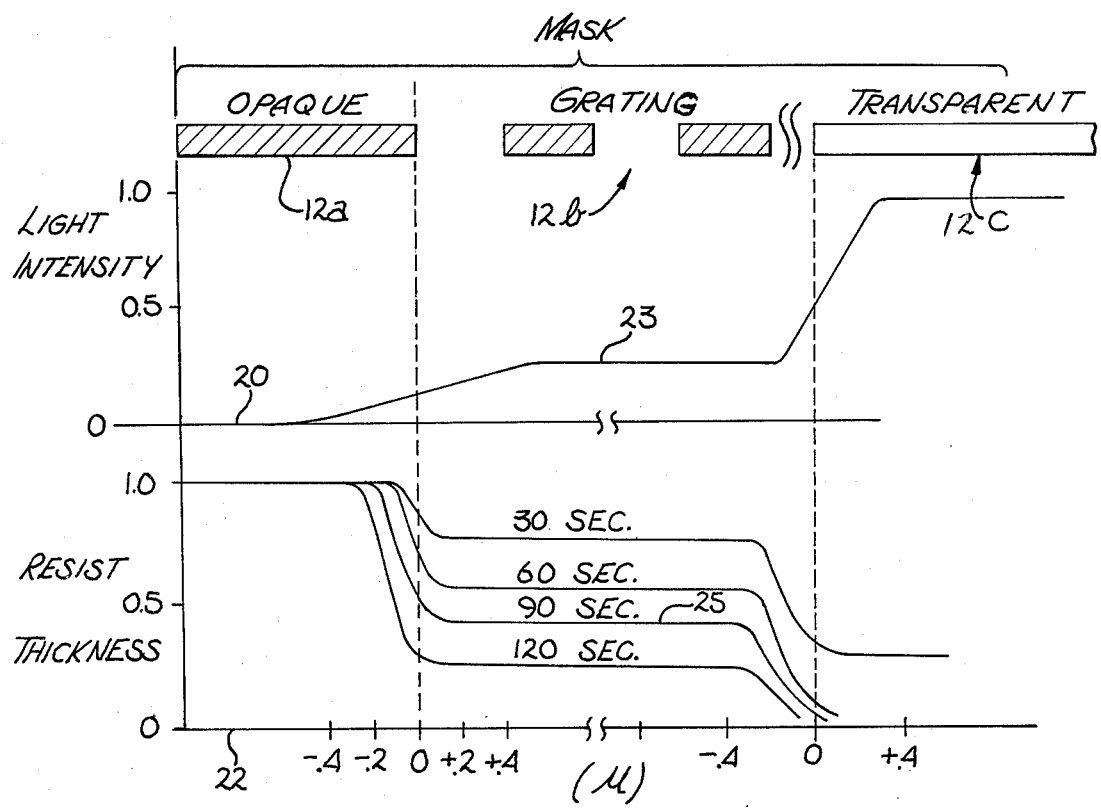

VARIABLE THICKNESS SELF-ALIGNED PHOTORESIST PROCESS

BACKGROUND OF THE INVENTION

1. Field of the Invention

The invention relates to the exposure of photo-sensitive layers, particularly photoresist layers, employed in the fabrication of integrated circuits.

2. Prior Art

In the photolithographic fabrication of integrated circuits, photo-sensitive layers, referred to commonly as photoresist layers, are exposed to light which is projected through a masking member or reticle. After the photoresist layer is developed, the patterns defined by the masking member are used to form various circuit elements and regions. Most often the masking member has opaque and transparent areas which result (after the photoresist is developed) into regions of the photoresist material and regions with no such material.

In some applications, it is desirable to have a photoresist layer (after developing) which has regions of different thicknesses. One method of obtaining these regions is to expose the photoresist layer through two different masking members in separate masking steps. This process, however, results in misalignments which are inherent when more than a single masking member is used. The same result is obtained with electron beam masking by having the beam expose some areas more than other areas, although this type of masking is currently more expensive than conventional projection or contact masking.

Related technology to the present invention is disclosed in U.S. Pat. Nos. 4,137,458 and 4,140,913.

As will be seen, the present invention provides a variable thickness, self-aligned photoresist layer with conventional masking techniques. The disclosed process lends itself to cost-efficient, high production processing using masking members which are readily fabricated with current technology.

SUMMARY OF THE INVENTION

A process for forming a layer of photo-sensitive material having two different thicknesses for use in the fabrication of integrated circuits is disclosed. A masking member is used which has at least one area which substantially blocks light and a second area which includes a plurality of spaced-apart lines of predetermined width. A projection means projects light which passes through the masking member onto a layer of photo-sensitive material. The width and spacing of the lines is selected such that the images of these lines cannot be resolved by the projection means. The photo-sensitive material receiving light which passed through the spaced-apart lines is illuminated at a uniform, intermediate intensity when compared to the light associated with the opaque and transparent areas of the masking member. Upon developing the photo-sensitive material, aligned regions in the layer of different thicknesses are formed.

BRIEF DESCRIPTION OF THE DRAWINGS

FIG. 1 illustrates a projection masking apparatus and a portion of a masking member or reticle in a plan view.

FIG. 2 is a series of graphs showing the light intensity incident on the photo-sensitive layer after passing through different areas of the masking member of FIG. 1 and the resultant thicknesses of the photo-sensitive layer as a function of developing time.

DETAILED DESCRIPTION OF THE INVENTION

Figure 3:
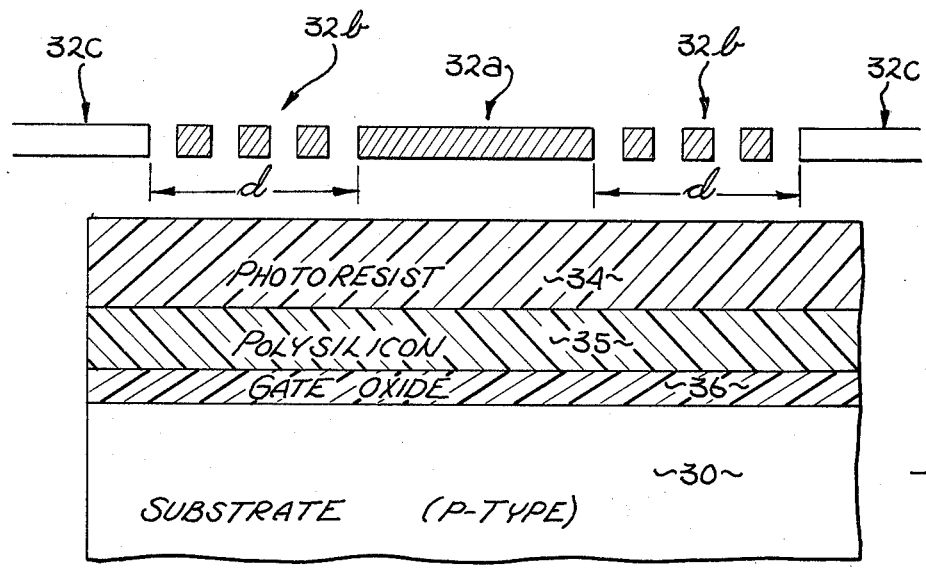
FIG. 3 is a cross-sectional elevation view of a portion of a substrate which includes a gate oxide layer, polysilicon layer and photoresist layer. Also illustrated in this FIGURE is an overlying masking member.

A process is described for forming different thickness regions in a photo-sensitive layer with a single masking step where the regions are self-aligned. The process has use in the fabrication of a plurality of different integrated circuit elements, structures and regions.

The presently preferred embodiment of the described process is used with metal-oxide-semiconductor (MOS) processing in the formation of a field-effect transistor for spacing the source and drain regions from the gate by a predetermined distance. It will be obvious to one skilled in the art that the process may be used with other integrated circuit techniques to form other regions and elements spaced-apart by a predetermined distance.

In the following description, specific details, such as specific thicknesses and energy levels, are set forth in order to provide a thorough understanding of the present invention. It will be obvious to one skilled in the art that these specific details are not required to practice the invention. In other instances, well-known processing steps are not set forth in detail in order not to obscure the present invention in unnecessary detail.

Referring first to FIG. 1, the illustrated masking projection apparatus includes a source of illumination, illuminator 10, which directs light through a masking member or reticle 12. The light from the masking member is projected by a lens system 14 onto an area 18 of the wafer 16. In this manner, a photoresist layer on the wafer is exposed and patterns are defined corresponding to those on the masking member 12. The projection apparatus, and in particular the lens system 14, is able to resolve only images greater than some predetermined dimension, as is normally the case.

Most typically, the masking member includes opaque areas and transparent areas. These areas are shown as areas 12a and 12c in FIG. 1. In the present invention, the masking member also includes areas having a plurality of spaced-apart parallel lines (e.g., periodic grating) of predetermined line width and spacing, shown as area 12b.

Assume for purposes of discussion that the apparatus of FIG. 1 includes a commercially available stepper, such as GCA DSW 4800, and that the illumination source provides light at a frequency of 4356 Å. If the lens system has a numerical aperture of 0.28, the minimum resolvable line width is approximately 1 micron. Also assume that the grating 12b consists of lines which are 0.4 microns wide separated by 0.4 micron spaces. These lines are not projected onto the photoresist layer since they are less than the resolution capability of the projection apparatus. Rather, the light passing through the grating is reduced in intensity; a uniform intensity results from the grating. This intensity is intermediate when compared to the intensity of light projected through the transparent area 12c and the substantially blocked light caused by the opaque area 12a.

In FIG. 2, the results of using a masking member of the configuration shown in FIG. 1 is illustrated where a positive photoresist (1 micron thick) is exposed and developed. The described results were obtained employing a commercially available photoresist (Shipley AZ 1350J). The intensity level from the illuminator for the described processing is 150 mJ/cm$^2$. The masking member employed is a chrome formed mask, although masking members formed with other materials may be used.

Referring now to FIG. 2, the masking member of FIG. 1 is again shown with the opaque area 12a, grating 12b and transparent area 12c. The effects of this member on the light intensity incident on the photoresist layer is shown directly below the three areas of the masking member on axis 20. Below the opaque area 12a, there is no light incident on the photoresist layer. Under the transparent area 12c of the masking member, the light intensity is substantially at full intensity, normalized to 1.0. In the central section 23 of the graph, the light intensity is intermediate between the intensity from the opaque area 12a and transparent area 12c. Note that the change in intensity from one masking area to the other is somewhat gradual although this gradient is not as severe as appears from the graph. As may be seen from the dimensions on axis 22, the area of nonuniform intensity is only a few tenths of a micron wide. Where the grating, for example, is several microns wide, the intensity of the light from the grating is substantially uniform such as shown by the section 23 of the graph.

For the above-described positive photoresist layer of one micron in thickness, the resultant thickness of this layer after developing is shown on axis 22 for development times of 30 seconds, 60 seconds, 90 seconds and 120 seconds. For the described embodiment, a 90 second development time, as shown by line 25, yields an intermediate photoresist thickness of approximately 0.5 microns. Thus, two different thicknesses of photoresist are obtained; for the 90 second development time a one micron thick layer under the opaque masking areas and approximately 0.5 microns thick layer under the grating results (in addition to the regions having no photoresist under the transparent areas of the mask).

It should be noted that the regions of variable thickness are self-aligned with one another since only a single mask is employed to obtain the variable thickness.

The above-described variable thickness photoresist process may be used to form source and drain regions in a field-effect transistor which are spaced-apart from the gate by a predetermined distance. Often, source and drain regions are formed in alignment with the gate. During subsequent processing, particularly high temperature steps, the dopant from these regions laterally diffuses, causing the gate to overlap the regions. This overlapping increases the Miller capacitance, thereby reducing the high frequency characteristics of the transistor. Deterioration in the punch-through characteristics occurs as well. Numerous other processes are well-known for forming the source and drain regions spaced-apart from the gate such that during subsequent processing steps, these regions (after the lateral diffusion) become more precisely aligned with the gate. However, these other processes are generally more complicated than the present invention.

Referring to FIG. 3, a p-type monocrystalline silicon substrate 30 is shown with an overlying oxide layer (gate oxide layer 36). A polysilicon layer 35 is formed over the gate oxide layer 36. A photoresist layer 34 is then formed over the polysilicon layer 35 using well-known processing.

The masking member used to define a gate, and source and drain regions, is shown above the substrate in FIG. 3. This member has an opaque area 32a, adjacent areas 32b which comprise gratings and areas 32c which are transparent areas disposed along the opposite edges of the areas 32b.

Figure 4:
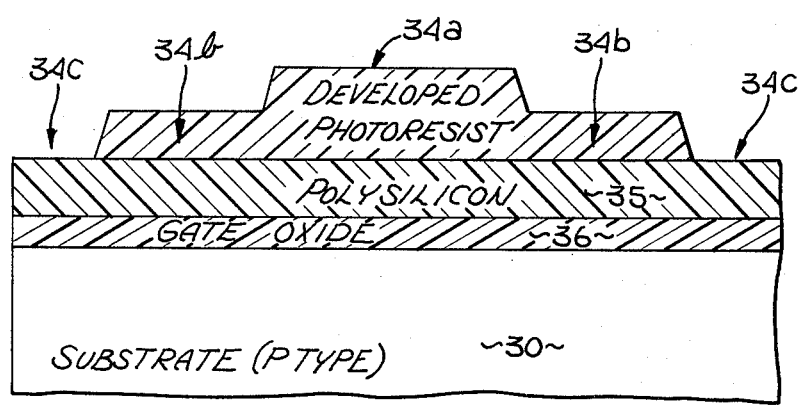
FIG. 4 illustrates the substrate of FIG. 3 after the photoresist layer has been exposed and developed.

In FIG. 4, the photoresist layer is shown after exposure and developing. As previously described, the areas 32b are not optically resolvable by the projection apparatus and the regions of the photoresist receiving light from these areas are exposed to an intermediate light intensity. The resultant photoresist layer includes the region 34a corresponding to area 32a of, for example, one micron in thickness. The regions 34b as a result of the grating have a thickness of approximately 0.5 microns, and regions 34c below the transparent areas of the masking member have no photoresist.

Figure 5:
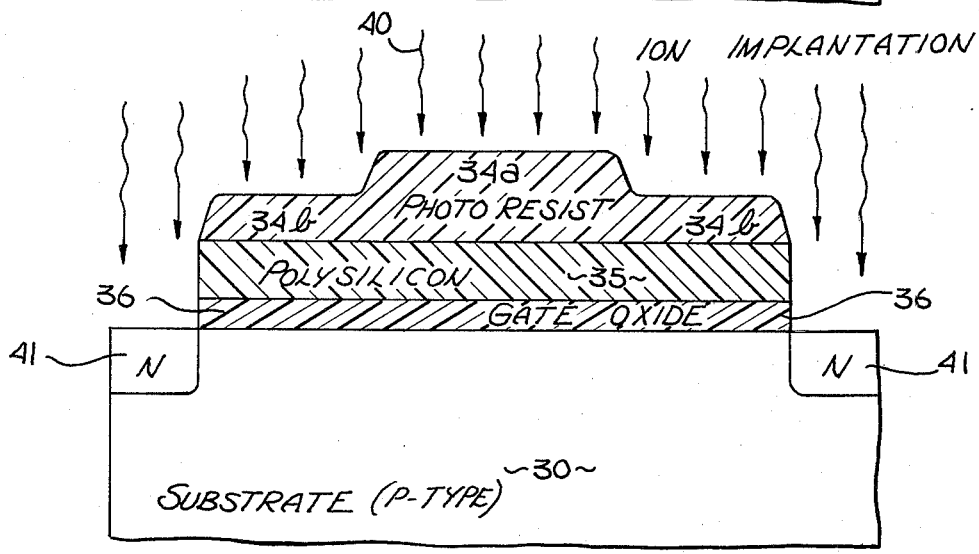
FIG. 5 illustrates the substrate of FIG. 4 after etching steps and during an ion implantation step used to form doped regions in the substrate; and, FIG. 6 illustrates the substrate of FIG. 5 after additional etching steps used to define a gate which is spaced-apart from the doped regions.

Next, as shown in FIG. 5, plasma etching steps are employed to etch away the polysilicon 35 and the gate oxide 36 in alignment with the edges of the photoresist layer. Then the substrate is subjected to ion implantation 40. This ion implantation, which is blocked by the photoresist, forms the source and drain regions 41 in alignment with the edges of the photoresist. In the presently preferred embodiment, an arsenic implant is employed to form the n-type regions 41.

Now, the substrate is subjected to a well-known etchant to etch the photoresist layer. The etching time, however, is selected to remove, for example, only half the thickness of the photoresist layer. Thus, the polysilicon below the photoresist regions 34b is exposed whereas the polysilicon beneath the region 34a remains covered. Then with plasma etching steps, the gate 35a shown in FIG. 6 and the underlying gate oxide 36a are defined. (Well-known intermediate steps, such as the growing of protective oxides, are not shown.)

The gate 35a and gate oxide 36a are spaced-apart from the regions 41 by the distance d. This distance corresponds to the dimension d of the grating (areas 32b) of FIG. 3 (assuming no reduction by the projection apparatus). Thus, by the selection of the dimension of the grating, the distance d of FIG. 6 may be precisely controlled.

Figure 6:
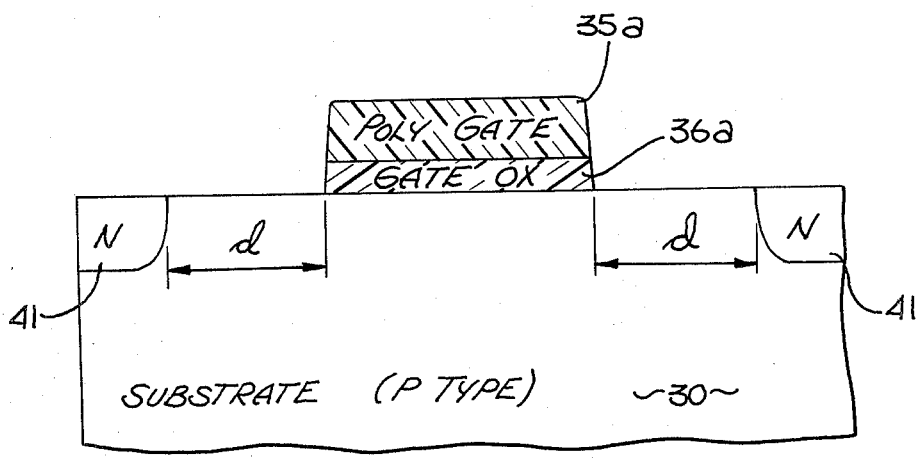

The remaining steps to complete the transistor of FIG. 6 are not illustrated. These steps, which include metalization, etc., are very well-known in the art.

While in the presently preferred process lines in a periodic grating are used, other mask features may be employed to obtain the same result. For example, a plurality of lines defining squares, solid squares, dots, or the like, may be used. The dimensions and spacing of these features may be selected such that the features are not resolvable, thus providing the intermediate intensity. Also, while in the presently preferred process only two different thicknesses of photoresist result (plus the "zero thickness"), the process can be extended to provide more than two thicknesses of photoresist. Periodic gratings or other features may provide, for example, areas of photoresist which receive no light, 25% intensity, 75% intensity and full intensity by properly selecting the relative densities of the lines or features. This would result in three different thicknesses of photoresist after developing in addition to the "zero thickness" regions.

The above-described variable thickness photoresist process may be employed in numerous other applications, for example, to obtain spacing between a field implant and field oxide edge. The same techniques may be employed to fabricate elements in two distinct layers where the elements are of different dimensions or where two processing steps such as etching, implantation, oxidation, or deposition are used to form self-aligned features.

Thus, a process has been disclosed which permits the fabrication of self-aligned features in integrated circuits by using a variable thickness photoresist. The described process is valuable for reducing die size and provides die yield improvements when compared to prior art techniques, and the misalignments which result from two masking steps.

We claim:

1. In the fabrication of integrated circuits, a process for forming a layer of photo-sensitive material having two different thicknesses comprising the steps of:
   providing a masking member having at least one area which substantially blocks light and a second area which includes a plurality of spaced-apart features of predetermined dimensions and spacing;
   projecting light with a projection means through said masking member onto a layer of said photo-sensitive material, said projection means for resolving images only with dimensions greater than those of said features, such that said photo-sensitive material receiving light passing through said second area of said masking member is uniformly illuminated at an intermediate intensity; and
   developing said photo-sensitive material;
   whereby two different thicknesses of said layer are formed with a single masking step.

2. The process defined by claim 1 wherein said spaced-apart features define a periodic grating.

3. In the fabrication of integrated circuits, a process for forming a photoresist layer having two thicknesses comprising the steps of:
   providing a masking member having first areas which freely pass light, second areas which are substantially opaque and third areas comprising spaced apart features of predetermined dimensions and spacing;
   projecting light through said masking member onto said photoresist layer with a projection apparatus, said apparatus being unable to optically resolve the image of said third areas, such that the portion of said layer receiving light passing through said third areas is illuminated at an intermediate intensity; and
   developing said photoresist layer;
   whereby two different thicknesses of said layer are formed with a single masking step.

4. The process defined by claim 3 wherein said features comprise a grating.

5. In the fabrication of integrated circuits, a process for forming a photoresist layer having two thicknesses comprising the steps of:
   providing a masking member having first areas which freely pass light, second areas which are substantially opaque and third areas which partially pass light;
   projecting light onto a photoresist layer with a projection apparatus such that first regions of said photoresist layer which receive light from said first areas of said masking member are fully exposed, second regions of said photoresist layer which receive light from said second areas of said masking member are substantially unexposed, and third regions of said photoresist layer which receive light from said third areas of said masking member are illuminated at an intermediate intensity; and
   developing said photoresist layer;
   whereby two different thicknesses of said layer are formed with a single masking step.

6. The process defined by claim 5 wherein said third areas of said masking member comprise spaced-apart lines of predetermined width and spacing and wherein said projection apparatus is unable to optically resolve the image of said lines.

7. The process defined by claim 6 wherein said third areas of said masking member comprise a periodic grating.

8. A process for forming a doped region in a substrate spaced-apart from a polysilicon gate member by a predetermined distance comprising the steps of:
   forming a polysilicon layer above said substrate;
   forming a photoresist layer over said polysilicon layer;
   exposing said photoresist layer to a masking member which includes a first area which substantially blocks light, a second area adjacent to said first are a having a width corresponding to said predetermined distance, said second area comprising a plurality of lines of preselected width and spacing and a third area adjacent to said second area which freely passes light;
   projecting light with a projection apparatus through said masking member to expose said photoresist layer, said projection apparatus having a maximum resolution less than that required to project said lines;
   developing said photoresist layer to form a first region of a first thickness, a second region of a second thickness, said second thickness being less than said first thickness, said first and second regions corresponding to said first and second areas, respectively, of said masking member;
   doping said substrate employing said photoresist layer as a mask to form said doped region, said doped region being formed in alignment with said second region of said photoresist layer;
   etching said photoresist layer so as to remove a thickness of photoresist approximately equal to said second thickness; and
   etching said polysilicon layer using said first region of said photoresist layer as a mask to form said gate member;
   whereby said doped region is spaced-apart from said gate member by said predetermined distance.

9. The process defined by claim 8 wherein an oxide layer is disposed between said polysilicon layer and said substrate.

10. The process defined by claim 9 wherein said doping comprises ion implantation.

11. The process defined by claim 8 wherein said plurality of lines comprises a periodic grating.

* * * * *